(12) United States Patent
Yeh et al.

(10) Patent No.: US 11,985,822 B2
(45) Date of Patent: May 14, 2024

(54) MEMORY DEVICE

(71) Applicant: MACRONIX INTERNATIONAL CO., LTD., Hsinchu (TW)

(72) Inventors: Teng-Hao Yeh, Zhubei (TW); Chih-Wei Hu, Miaoli County (TW); Hang-Ting Lue, Hsinchu (TW); Guan-Ru Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 407 days.

(21) Appl. No.: 17/009,968

(22) Filed: Sep. 2, 2020

(65) Prior Publication Data
US 2022/0068957 A1   Mar. 3, 2022

(51) Int. Cl.
| | | |
|---|---|---|
| H01L 27/115 | (2017.01) |
| H01L 23/522 | (2006.01) |
| H01L 23/535 | (2006.01) |
| H01L 27/11565 | (2017.01) |
| H01L 27/11582 | (2017.01) |
| H10B 43/10 | (2023.01) |
| H10B 43/27 | (2023.01) |

(52) U.S. Cl.
CPC ......... H10B 43/27 (2023.02); H01L 23/5226 (2013.01); H10B 43/10 (2023.02)

(58) Field of Classification Search
CPC ......... H01L 27/11582; H01L 27/11524; H01L 27/11556; H01L 27/1157; H01L 27/11565; H01L 27/11521; H01L 27/11551; H01L 27/11568; H01L 27/11578; H01L 27/11575; H01L 23/5283; H10B 43/27; H10B 41/10; H10B 41/27; H10B 41/40; H10B 43/10; H10B 43/40; H10B 43/20
See application file for complete search history.

(56) References Cited

U.S. PATENT DOCUMENTS

| | | | |
|---|---|---|---|
| 9,881,929 B1 * | 1/2018 | Ravikirthi | H10B 43/27 |
| 10,283,522 B2 * | 5/2019 | Zushi | H01L 29/1033 |
| 10,381,375 B2 * | 8/2019 | Choi | H01L 29/1079 |
| 10,553,609 B2 * | 2/2020 | Lee | H01L 21/76802 |
| 10,559,533 B2 * | 2/2020 | Sasaki | H01L 27/11575 |
| 10,892,279 B1 * | 1/2021 | Sakotsubo | H01L 27/11582 |
| 11,031,333 B2 * | 6/2021 | Zhu | H01L 25/50 |
| 11,133,329 B2 * | 9/2021 | Lue | H10B 51/20 |
| 11,678,486 B2 * | 6/2023 | Lue | H10B 43/10 257/324 |
| 11,778,823 B2 * | 10/2023 | Yeh | H10B 43/10 257/314 |

(Continued)

FOREIGN PATENT DOCUMENTS

CN   109935596 A  *  6/2019

Primary Examiner — Mary A Wilczewski
Assistant Examiner — Tsz K Chiu
(74) Attorney, Agent, or Firm — McClure, Qualey & Rodack, LLP

(57) ABSTRACT

A memory device is provided. The memory device includes a stacked structure, a tubular element, a conductive pillar and memory cells. The tubular element includes a dummy channel layer and penetrates the stacked structure. The conductive pillar is enclosed by the tubular element and extending beyond a bottom surface of the dummy channel layer. The memory cells are in the stacked structure and electrically connected to the conductive pillar.

18 Claims, 11 Drawing Sheets

(56) References Cited

U.S. PATENT DOCUMENTS

| | | | |
|---|---|---|---|
| 2008/0265235 A1* | 10/2008 | Kamigaichi | H10B 63/30 257/E47.001 |
| 2010/0320526 A1* | 12/2010 | Kidoh | H10B 43/27 257/E21.409 |
| 2011/0169071 A1* | 7/2011 | Uenaka | H01L 27/11582 257/326 |
| 2013/0037860 A1* | 2/2013 | Jang | H10B 41/10 257/E27.081 |
| 2015/0179662 A1* | 6/2015 | Makala | H01L 27/11556 257/314 |
| 2017/0077027 A1* | 3/2017 | Shimizu | H01L 27/11568 |
| 2017/0194345 A1* | 7/2017 | Nojima | H10B 43/27 |
| 2018/0240811 A1 | 8/2018 | Hongsoo et al. | |
| 2018/0247953 A1 | 8/2018 | Lee | |
| 2018/0269219 A1* | 9/2018 | Ito | H01L 27/11573 |
| 2019/0319044 A1* | 10/2019 | Harari | H01L 23/5226 |
| 2019/0333923 A1* | 10/2019 | Kim | H01L 27/11556 |
| 2020/0035700 A1* | 1/2020 | Xu | H10B 43/27 |
| 2020/0365613 A1* | 11/2020 | Wang | H10B 43/10 |
| 2020/0381450 A1* | 12/2020 | Lue | H10B 43/27 |
| 2021/0183882 A1* | 6/2021 | Zhang | H10B 43/40 |
| 2021/0399016 A1* | 12/2021 | Jiang | H10B 41/10 |
| 2022/0013535 A1* | 1/2022 | Lue | H10B 43/35 |
| 2022/0130862 A1* | 4/2022 | Lue | H10B 51/20 |
| 2022/0199639 A1* | 6/2022 | Yeh | H10B 41/41 |
| 2023/0036595 A1* | 2/2023 | Thimmegowda | H10B 43/50 |

\* cited by examiner

MEMORY DEVICE

BACKGROUND

Technical Field

The disclosure relates to a memory device, and more particularly to a memory device having a conductive pillar enclosed by a tubular element.

Description of the Related Art 3-dimensional (3D) memory devices have been developed for a long time since planar memory devices, i.e. 2-dimensional memory devices, reached scaling limitations and did not meet market demand. However, the development of 3D memory devices faces huge challenges, such as high cost, difficulties on manufacturing process integration, structural stability of memory devices, electrical characteristics of memory devices, complicated device design and so on. In order to solve these problems, the development of new 3D memory device becomes increasingly important.

It is desirable to provide technology for a memory device with an improved layout.

SUMMARY

The present disclosure relates to a memory device.

According to an embodiment of the present disclosure, a memory device is provided. The memory device includes a stacked structure, a tubular element, a conductive pillar and memory cells. The tubular element includes a dummy channel layer and penetrates the stacked structure. The conductive pillar is enclosed by the tubular element and extending beyond a bottom surface of the dummy channel layer. The memory cells are in the stacked structure and electrically connected to the conductive pillar.

The above and other embodiments of the disclosure will become better understood with regard to the following detailed description of the non-limiting embodiment(s). The following description is made with reference to the accompanying drawings.

DETAILED DESCRIPTION

Figure 1:
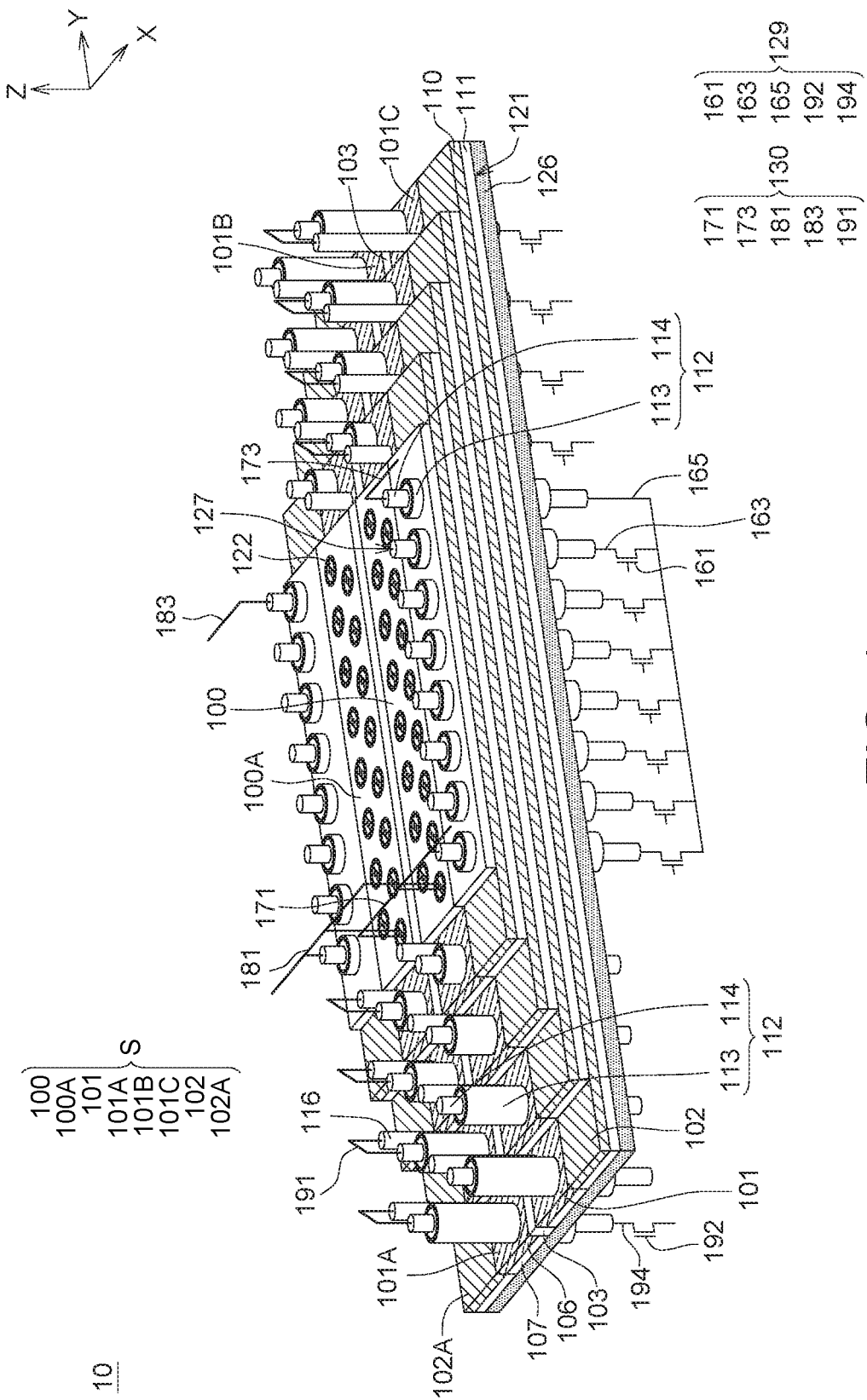
FIG. 1 illustrates a schematic stereoscopic view of a memory device according to an embodiment of the present disclosure.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

FIG. 1 illustrates a schematic stereoscopic view of a memory device according to an embodiment of the present disclosure. The memory device 10 may include a 3D non-volatile memory, such as a NOR flash memory, a NAND flash memory, or other types of memories. The memory device 10 may include a stacked structure S. The stacked structure S may include a main stacked structure 100, a staircase structure 101 and an insulating stacked structure 102. The main stacked structure 100, the staircase structure 101 and the insulating stacked structure 102 may be adjacent to each other. The main stacked structure 100, the staircase structure 101 and the insulating stacked structure 102 may be disposed in a non-overlap manner in a vertical direction, such as a Z direction. The main stacked structure 100 and the staircase structure 101 may be disposed along a lateral direction, such as a Y direction, but without overlapping to each other in a longitudinal direction, such as a X direction. The main stacked structure 100 and the insulating stacked structure 102 may be disposed along the X direction, but without overlapping to each other in the Y direction. Similarly, the staircase structure 101 and the insulating stacked structure 102 may be disposed along the X direction, but without overlapping to each other in the Y direction.

In an embodiment, as shown in FIG. 1, the memory device 10 may have four staircase structures 101/101A/101B/101C, the staircase structure 101 and the staircase structure 101A are disposed adjacent to each other and separated by an insulating element 103; the staircase structure 101B and the staircase structure 101C are disposed adjacent to each other and separated by the insulating element 103. The staircase structure 101 and the staircase structure 101C are disposed on opposite sides of the main stacked structure 100. The staircase structure 101A and the staircase structure 101B are disposed on opposite sides of the main stacked structure 100. In an embodiment, the staircase structure 101 and the staircase structure 101C may be disposed symmetrically. In an embodiment, the staircase structure 101A and the staircase structure 101B may be disposed symmetrically. In an embodiment, the memory device 10 may have two insulating stacked structures 102/102A disposed on opposite sides of the main stacked structure 100; the sides of the main stacked structure 100 where staircase structures 101/101A/101B/101C are disposed and the sides of the main stacked structure 100 where insulating stacked structures 102/102A are disposed are different. In an embodiment, two insulating stacked structures 102/102A may be disposed symmetrically.

The insulating element 103 may extend along the Y direction to separate the main stacked structure 100 and the main stacked structure 100A. The memory device 10 may have one or more main stacked structures 100/100A, one or more staircase structures 101/101A/101B/101C, and one or more insulating stacked structures 102/102A as required. As shown in FIG. 1, the insulating element 103 may extend along the Y direction to separate the staircase structure 101 and the staircase structure 101A, the main stacked structure 100 and the main stacked structure 100A, as well as the staircase structure 101B and the staircase structure 101C. In an embodiment, the insulating element 103 may include an insulating material.

Figure 2A:
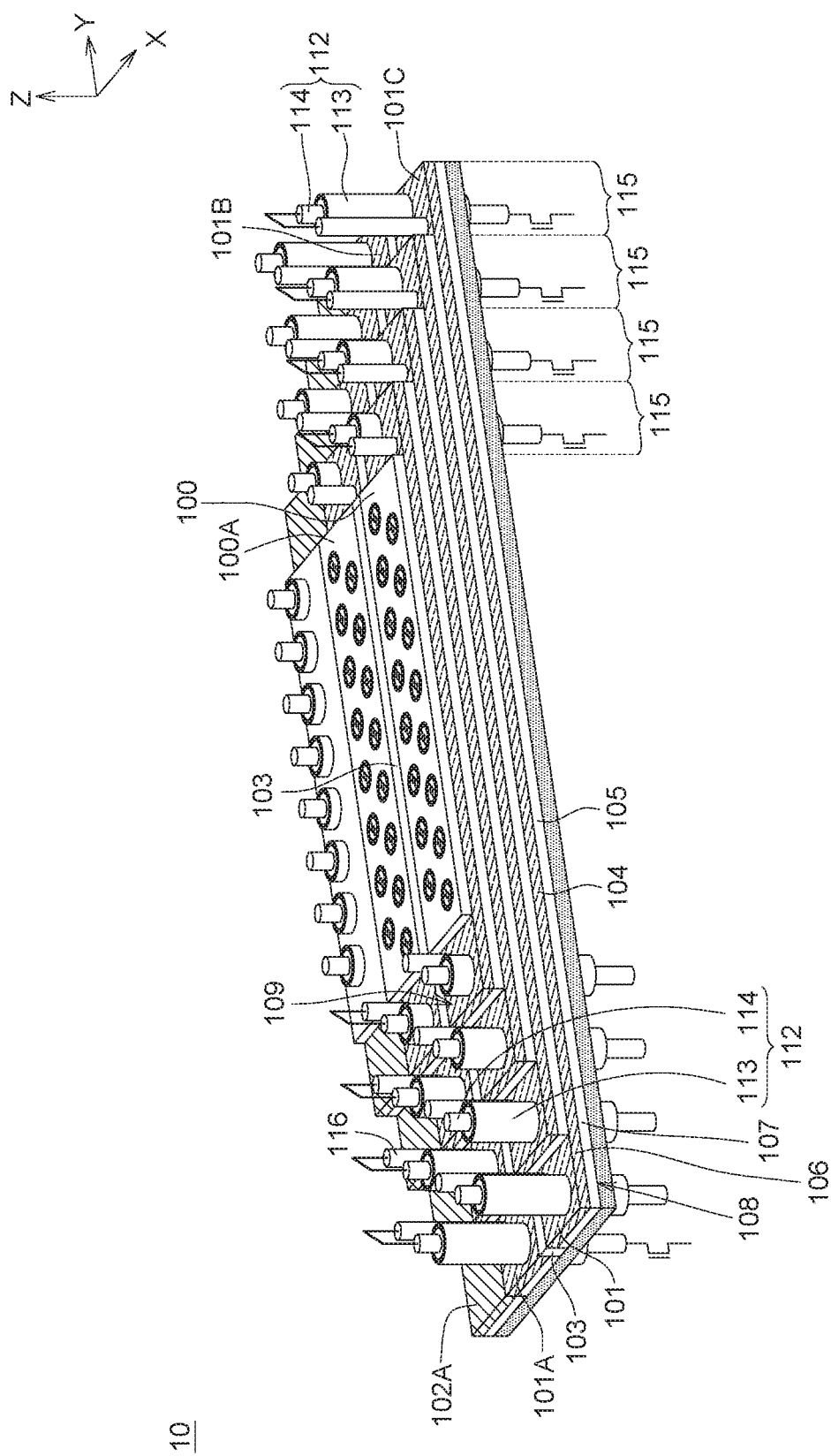
FIG. 2A illustrates a schematic stereoscopic view of a memory device according to an embodiment of the present disclosure.

FIG. 2A illustrates a schematic stereoscopic view of the memory device 10 without showing a portion of the memory device 10 corresponding to the insulating stacked structure 102 in FIG. 1. Referring to FIGS. 1 and 2A, the main stacked structure 100 may include conductive films 104 and first insulating layers 105 stacked alternately along the Z direction. The first insulating layers 105 are separated from each other by the conductive films 104. In an embodiment, the conductive films 104 of the main stacked structure 100 may include conductive materials, such as tungsten (W). The first insulating layers 105 of the main stacked structure 100 may include insulating materials, comprising an oxide such as silicon oxide.

The staircase structure 101 may include conductive stair layers 106 and insulating stair layers 107 stacked alternately along the Z direction. The insulating stair layers 107 are separated from each other by conductive stair layers 106. Each of the conductive stair layers 106 has different lateral area in a X-Y plane. For example, the lateral area of the conductive stair layer 106 becomes smaller from a bottom surface 108 of the staircase structure 101 to a top surface 109 of the staircase structure 101 along the Z direction. For example, a conductive stair layer 106 at a lower level has a lateral area larger than a lateral area that a conductive stair layer 106 at an upper level has. In an embodiment, the conductive stair layers 106 of the staircase structure 101 may include conductive materials, such as tungsten (W). The insulating stair layers 107 of the staircase structure 101 may include insulating materials, comprising an oxide such as silicon oxide.

The insulating stacked structure 102 may include second insulating layers 110 and third insulating layers 111 stacked alternately along the Z direction. The third insulating layers 111 are separated from each other by second insulating layers 110. In an embodiment, the second insulating layers 110 of the insulating stacked structure 102 may include insulating materials, comprising a nitride, such as silicon nitride. The third insulating layers 111 of the insulating stacked structure 102 may include insulating materials, comprising an oxide such as silicon oxide. In an embodiment, the second insulating layers 110 and the third insulating layers 111 may include different materials.

In an embodiment, the conductive films 104 of the main stacked structure 100 may be electrically connected to the conductive stair layers 106 of the staircase structure 101. The insulating stacked structure 102 may be electrically insulated. The conductive films 104 of the main stacked structure 100 and the conductive stair layers 106 of the staircase structure 101 may be functioned as gate structures of the memory device 10.

In an embodiment, the first insulating layers 105 of the main stacked structure 100, the insulating stair layers 107 of the staircase structure 101 and the third insulating layers 111 of the insulating stacked structure 102 may have a one-to-one correspondence, that is, a first insulating layer 105, a corresponding insulating stair layer 107 and a corresponding third insulating layer 111 may have the same height in the Z direction.

The memory device 10 may include column structures 112 arranged apart in the insulating stacked structure 102 and the staircase structure 101. The column structures 112 pass through the insulating stacked structure 102 and the staircase structure 101 in the Z direction. Each of the column structures 112 includes a tubular element 113 and a conductive pillar 114. The tubular element 113 penetrates the stacked structure S. Specifically, the conductive pillar 114 is enclosed by the tubular element 113. In an embodiment, the column structure 112 may have a structure similar to a coaxial cable. The conductive pillar 114 and the tubular element 113 may extend along the Z direction and pass through the insulating stacked structure 102 and the staircase structure 101. The conductive pillar 114 may include a conductive material, such as tungsten (W).

In the insulating stacked structure 102, each of the column structures 112 passes through the same amount of the second insulating layers 110. In the staircase structure 101, the column structures 112 respectively pass through different amounts of the conductive stair layers 106. For example, the staircase structure 101 may include stair units 115 (as shown in FIG. 2A), each of the stair units 115 has different amount of the conductive stair layers 106, and the column structures 112 in the staircase structure 101 is arranged in the stair units 115 respectively.

The memory device 10 may include conductive plugs 116 disposed on the conductive stair layers 106 of the staircase structure 101. Specifically, each of the conductive plugs 116 may be disposed on a different level of the conductive stair layer 106 of the staircase structure 101. The conductive plugs 116 may be arranged on the stair units 115 respectively. The conductive plug 116 is electrically connected on one conductive stair layer 106 where the conductive plug 116 is disposed, and the tubular element 113 and the conductive pillar 114 pass through the one conductive stair layer 106 of the conductive stair layers 106.

Figure 2B:
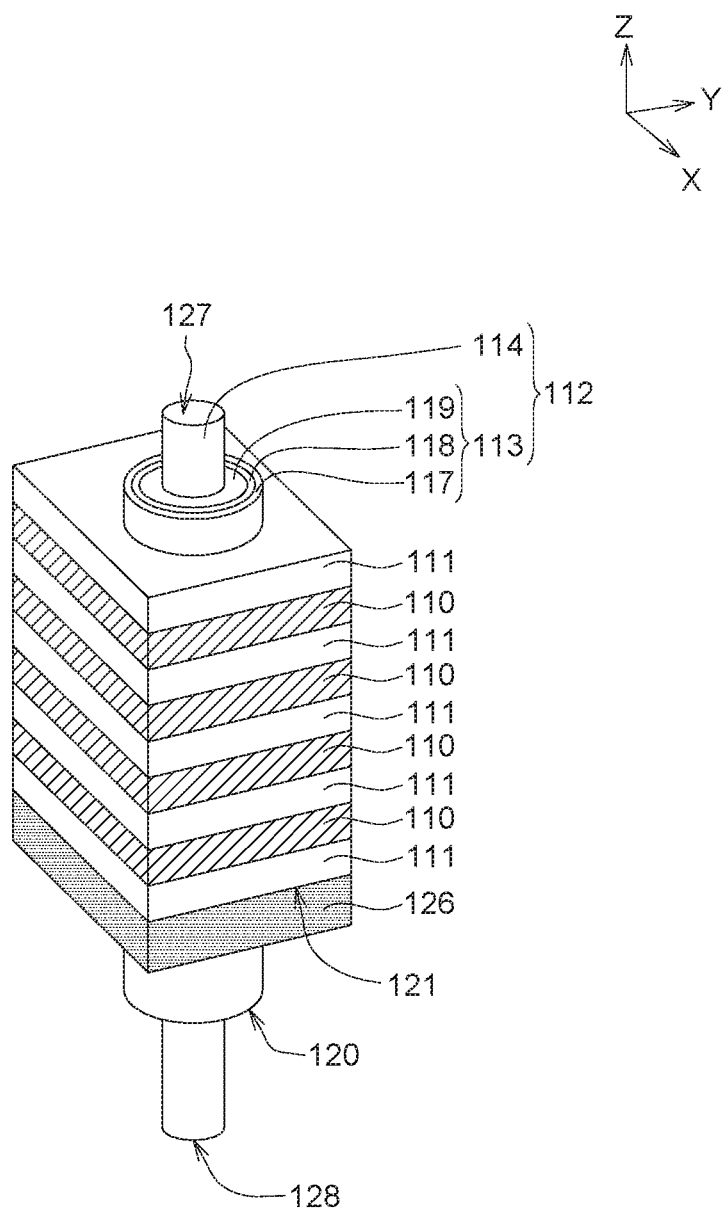
FIG. 2B illustrates one of the column structures in the insulating stacked structure shown in FIG. 1.
Figure 2C:
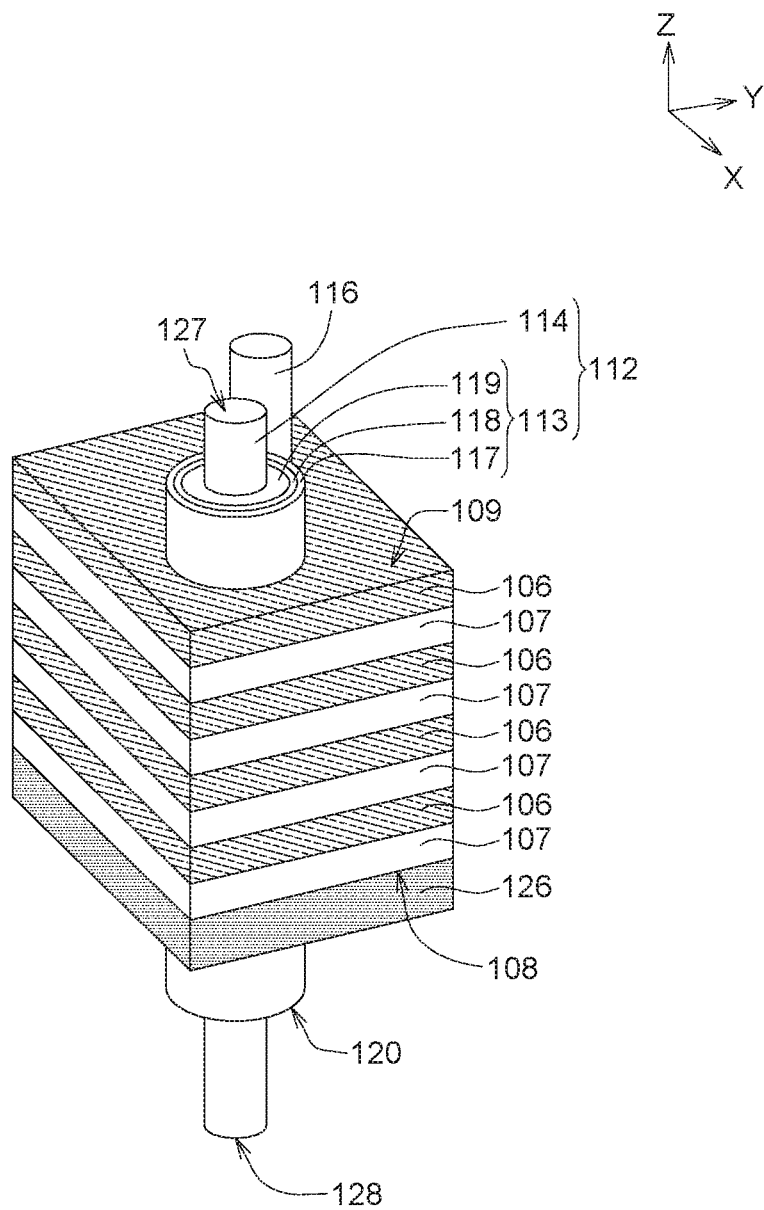
FIG. 2C illustrates one of the column structures in the staircase structure shown in FIG. 1.

FIG. 2B illustrates one of the column structures 112 in the insulating stacked structure 102 shown in FIG. 1. FIG. 2C illustrates one of the column structures 112 in the staircase structure 101 shown in FIG. 1.

Referring to FIGS. 1 and 2B-2C, in the insulating stacked structure 102 and the staircase structure 101, the tubular element 113 may include a memory film 117, a dummy channel layer 118 and an insulating film 119. The conductive pillar 114 is enclosed by the tubular element 113 and extending beyond a bottom surface 120 of the dummy channel layer 118. In an embodiment, the bottom surface 120 of the dummy channel layer 118 may extend beyond a bottom surface 121 of the insulating stacked structure 102 and a bottom surface 108 of the staircase structure 101 along the Z direction, and the conductive pillar 114 may extend beyond the bottom surface 121 of the insulating stacked structure 102, the bottom surface 108 of the staircase structure 101 and the bottom surface 120 of the dummy channel layer 118 along the Z direction.

The memory film 117 may include a multilayer structure known from memory technologies as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), MA BE-SONOS (metal-high-k bandgap-engineered silicon-oxide-nitride-oxide-silicon), and combinations of those layers. The memory film 117 may have a tubular shape and enclose the conductive pillar 114.

In an embodiment, the memory device 10 may include a memory layer including the memory film 117 and a memory material; the memory material is formed between the memory film 117 and the conductive films 104 of the main stacked structure 100. The memory layer may include a charge trapping structure known from memory technologies as ONO, ONONO, ONONONO, SONOS, BE-SONOS, TANOS, MA BE-SONOS, and combinations of those layers. The charge trapping structure may use nitride, such as silicon nitride or other similar high dielectric constant (high-k) material including metal oxide, such as alumina ($Al_2O_3$), hafnium dioxide ($HfO_2$) and so on. The memory cells may be defined in the memory layer. For example, in the case of the memory layer including the memory film 117 and the memory material, the memory film 117 may be understood as a tunneling oxide layer, the memory film 117 may include silicon dioxide ($SiO_2$) or merely include silicon dioxide; the memory material may include a multilayer memory material, such as alumina, titanium nitride (TiN), ONO, ONONO, ONONONO, SONOS, BE-SONOS, TANOS, MA BE-SONOS, and combinations thereof.

The dummy channel layer 118 is disposed between the memory film 117 and the conductive pillar 114. The dummy channel layer 118 may include a semiconductor material, such as a doped semiconductor material or an undoped semiconductor material. In an embodiment, the dummy channel layer 118 may include polysilicon, such as a doped polysilicon or an undoped polysilicon. The dummy channel layer 118 may have a tubular shape and enclose the conductive pillar 114. In an embodiment, the dummy channel layer 118 may mean that the dummy channel layer 118 has no drive circuitry. In an embodiment, the dummy channel layer 118 may be understood as an electrically floating element.

The insulating film 119 is disposed between the conductive pillar 114 and the dummy channel layer 118. The insulating film 119 may have a tubular shape and enclose the conductive pillar 114. The insulating film 119 may include dielectric material comprising an oxide such as silicon oxide.

Figure 3:
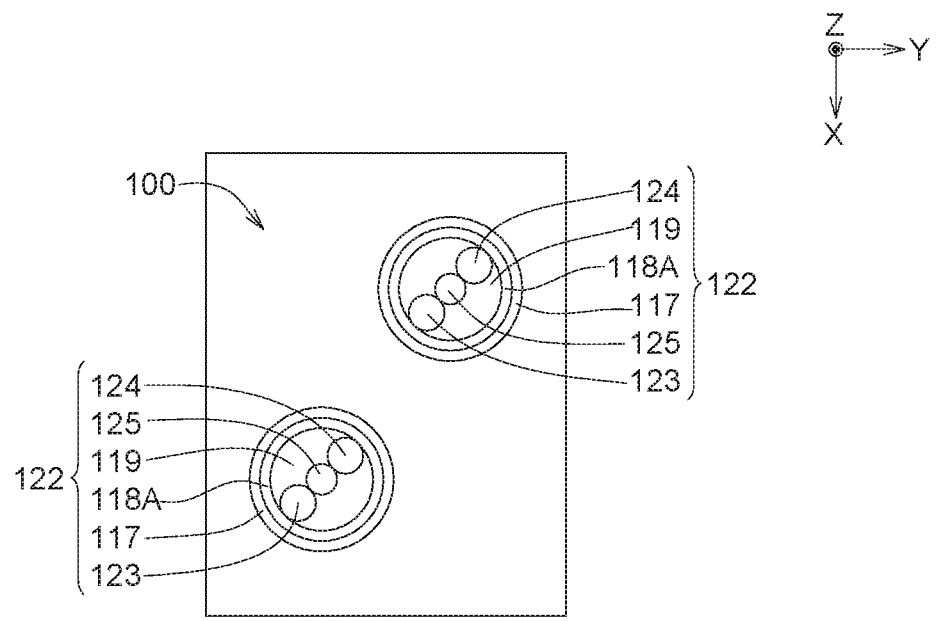
FIG. 3 illustrates a schematic top view of a main stacked structure according to an embodiment of the present disclosure.

FIG. 3 illustrates a schematic top view of a main stacked structure 100. Referring to FIGS. 1 and 3, the memory device 10 may include pillar elements 122 arranged apart in the main stacked structure 100. The pillar elements 122 extend along the Z direction and pass through the main stacked structure 100.

The pillar element 122 may include a memory film 117, a channel layer 118A, a source/drain pillar 123, a source/drain pillar 124, an insulating pillar 125 and an insulating film 119. The insulating pillar 125 is disposed between the source/drain pillar 123 and the source/drain pillar 124. The source/drain pillar 123 and source/drain pillar 124 are separated from each other by the insulating pillar 125. One of the source/drain pillar 123 and the source/drain pillar 124 is a source, and the other of the source/drain pillar 123 and the source/drain pillar 124 is a drain. The insulating film 119 is disposed between the channel layer 118A and the source/drain pillar 123, the source/drain pillar 124 and the insulating pillar 125. The channel layer 118A is disposed between the insulating film 119 and the memory film 117. The channel layer 118A may have a tubular shape and enclose the source/drain pillar 123, the source/drain pillar 124, the insulating film 119 and the insulating pillar 125. The memory film 117 may have a tubular shape and enclose the channel layer 118A. The memory film 117 of the pillar element 122 may be the similar to the memory film 117 of the tubular element 113. The source/drain pillar 123 and the source/drain pillar 124 may include doped semiconductor material, such as a N+ type polysilicon, or an undoped semiconductor material. The insulating pillar 125 may include an insulating material, comprising a nitride such as silicon nitride.

The memory device 10 may include memory cells disposed in the main stacked structure 100 and the main stacked structure 100 A. The memory cells may be defined in the memory film 117 at intersections between the conductive films 104 and the channel layer 118A of the pillar element 122. The pillar element 122 may be understood as an active pillar element. In an embodiment, the main stacked structure 100 may be disposed in an array region, and the staircase structure 101 may be disposed in a staircase region.

The dummy channel layer 118 of the tubular element 113 and the channel layer 118A of the pillar element 122 are different in that the dummy channel layer 118 is not functioned as providing a channel for electrons or electron holes when applying a voltage to the memory device 10.

Figure 4:
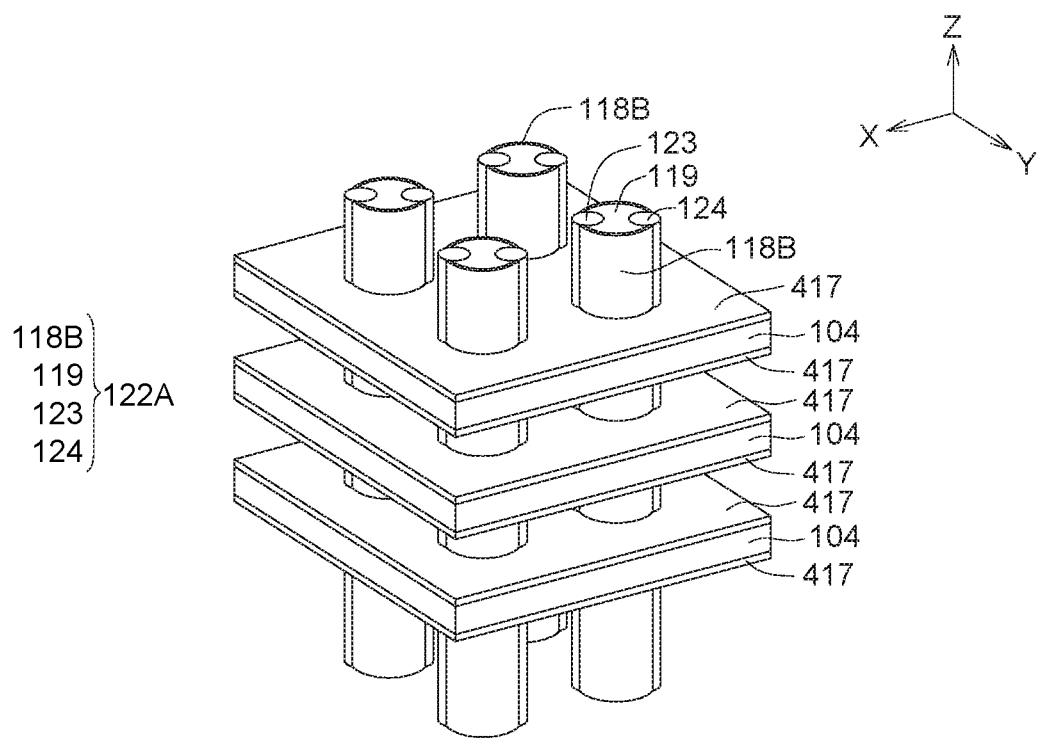
FIG. 4 illustrates a schematic stereoscopic view of a memory device according to an embodiment of the present disclosure.

FIG. 4 illustrates a schematic stereoscopic view of a pillar element 122A in a main stacked structure 100 according to another embodiment of the present disclosure. The difference between the pillar element 122A shown in FIG. 4 and the pillar element 122 shown in FIG. 3 is disclosed with the following description. The pillar element 122A includes a channel layer 118B, the source/drain pillar 123, the source/drain pillar 124 and the insulating film 119. The source/drain pillar 123 and the source/drain pillar 124 are separated from each other by the insulating film 119. The channel layer 118B shown in FIG. 4 is different from the channel layer 118A shown in FIG. 3 in that the channel layer 118B has an open ring shape, and has opposing ends respectively electrically connected to the source/drain pillar 123 and the source/drain pillar 124. The memory film 417 shown in FIG. 4 is different from the memory film 117 shown in FIG. 3 in that the memory film 417 is disposed on upper and lower surfaces of the conductive films 104 of the main stacked structure 100, and may be extended between an outer sidewall surface of the pillar element 122A and the conductive film 104.

In an embodiment, in a schematic stereoscopic view of a main stacked structure 100, the memory film 117 illustrated with referring to FIG. 3 may be arranged on the upper and lower surfaces of the conductive film 104, and may be extended between an outer sidewall surface of the pillar element 122 and the conductive film 104, similar to the arrangement for the memory film 417 illustrated with referring to FIG. 4.

Referring back to FIG. 1, the memory device 10 may include a polycrystalline semiconductor layer 126 below the main stacked structure 100, the staircase structure 101 and the insulating stacked structure 102. In other words, the polycrystalline semiconductor layer 126 is below the memory cells. The tubular elements 113, the conductive pillars 114 and the pillar elements 122 pass through the polycrystalline semiconductor layer 126. The polycrystalline semiconductor layer 126 may include a doped semiconductor material, such as P+ type polysilicon, or an undoped semiconductor material. The conductive pillar 114 may have an upper conductive pillar end 127 and a lower conductive pillar end 128 opposite to the upper conductive pillar end 127. The upper conductive pillar end 127 of the conductive pillar 114 is above the insulating stacked structure 102 and the staircase structure 101. The lower conductive pillar end 128 of the conductive pillar 114 is below the polycrystalline semiconductor layer 126.

The memory device 10 may include a semiconductor device 129. The semiconductor device 129 may be disposed below or under the polycrystalline semiconductor layer 126. Therefore, the semiconductor device 129 may be referred to as a lower semiconductor device. The semiconductor device 129 may include an active device and/or a passive device.

For example, the active device may include a transistor, a diode, a decoder, and so on. The passive device may include a resistor, a capacitor and/or an inductor.

The semiconductor device 129 may comprise a transistor 161, a lower conductive structure 163 and a lower conductive structure 165. The lower conductive structure 163 is electrically connected between the lower conductive pillar end 128 of the conductive pillar 114 and one of a source and a drain of the transistor 161. The lower conductive structure 165 is electrically connected between the lower conductive pillar end 128 of the conductive pillar 114 and the other of the source and the drain of the transistor 161.

Figure 5:
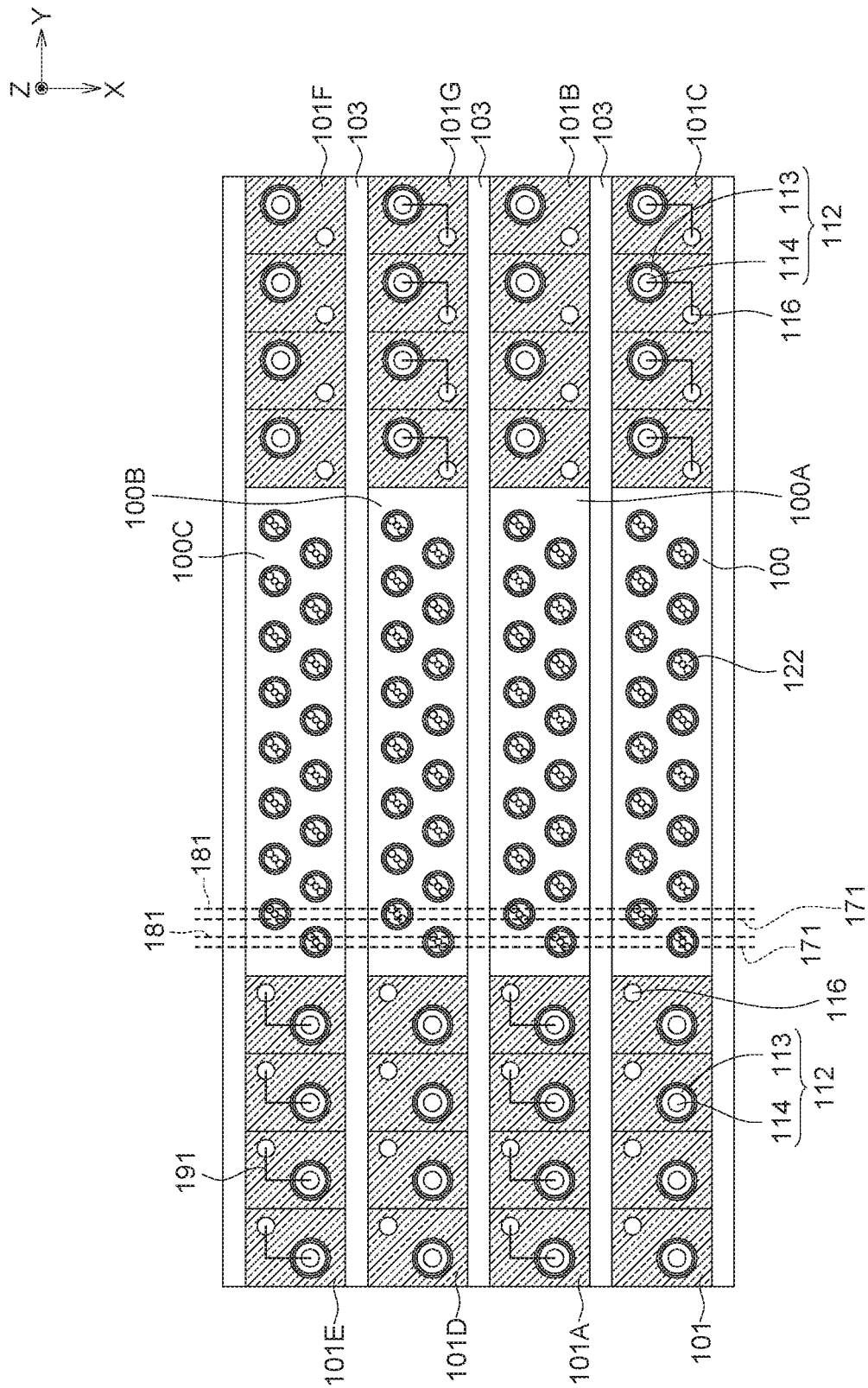
FIG. 5 illustrates a schematic top view of memory device according to an embodiment of the present disclosure.

FIG. 5 illustrates a schematic top view of memory device 10 according to an embodiment of the present disclosure. The difference between FIG. 1 and FIG. 5 is that the memory device 10 shown in FIG. 5 includes more main stacked structures 100/100A/100B/100C, and more staircase structures 101/101A/101B/101C/101D/101E/101F/101G, and the insulating stacked structures 102/102A are not shown in FIG. 5. Referring to FIGS. 1 and 5, the memory device 10 may include a conductive layer 130. The conductive layer 130 may be disposed above the main stacked structure 100, the insulating stacked structure 102 and the staircase structure 101. The conductive layer 130 may include an upper conductive structure 171, an upper conductive structure 173, an upper conductive structure 181, an upper conductive structure 183 and an upper conductive structure 191 disposed above or over the pillar elements 122 and/or the column structures 112.

The upper conductive structure 173 may be electrically connected onto the conductive pillar 114 of one of the column structures 112 in the insulating stacked structure 102. The upper conductive structure 171 may be electrically connected onto the conductive pillars 114 of the others of the column structures 112 in the insulating stacked structure 102. The upper conductive structure 171 is electrically connected between one of a source and a drain of the pillar element 122 and the conductive pillar 114. The upper conductive structure 171 is electrically connected between the memory cells and the upper conductive pillar end 127 of the conductive pillar 114 in the insulating stacked structure 102. The conductive pillar 114 of the one of the column structures 112 in the insulating stacked structure 102 is electrically connected between the lower conductive structure 165 and the upper conductive structure 173. The conductive pillars 114 of the other of the column structures 112 in the insulating stacked structure 102 are electrically connected between the lower conductive structure 163 and the upper conductive structure 171.

The upper conductive structure 183 may be electrically connected onto the conductive pillar 114 of one of the column structures 112 in the insulating stacked structure 102A. The conductive structure 181 may be electrically connected onto the conductive pillars 114 of the others of the column structures 112 in the insulating stacked structure 102A. The upper conductive structure 181 is electrically connected between the other of the source and the drain of the pillar element 122 and the conductive pillar 114. The upper conductive structure 181 is electrically connected between the memory cells and the upper conductive pillar end 127 of the conductive pillar 114 in the insulating stacked structure 102A. The conductive pillar 114 of the one of the column structures 112 in the insulating stacked structure 102A is electrically connected between the lower conductive structure 165 and the upper conductive structure 183. The conductive pillars 114 of the other of the column structures 112 in the insulating stacked structure 102A are electrically connected between the lower conductive structure 163 and the upper conductive structure 181.

In an embodiment, for example, the source of the pillar element 122 is electrically connected to the upper conductive structure 171, the conductive pillar 114 in the insulating stacked structure 102, the upper conductive structure 173, the lower conductive structure 163, the transistor 161, and the lower conductive structure 165. The upper conductive structure 171, the conductive pillar 114 in the insulating stacked structure 102, the upper conductive structure 173, and the lower conductive structure 163 and the lower conductive structure 165 electrically connected between the lower conductive pillar ends 128 of the conductive pillars 114 (i.e. effective conductive pillars or active conductive pillars) in the insulating stacked structure 102 may be functioned as source lines. For example, the upper conductive structure 173 may be functioned as a global source line or a common source line. The transistor 161 (switch) may be functioned as a source line transistor (source line switch). The conductive pillar 114 in the insulating stacked structure 102 may be functioned as a source line contact for the memory cells.

In an embodiment, for example, the drain of the pillar element 122 is electrically connected to the upper conductive structure 181, the conductive pillar 114 in the insulating stacked structure 102A, the upper conductive structure 183, the lower conductive structure 163, the transistor 161, and the lower conductive structure 165. The upper conductive structure 181, the conductive pillar 114 in the insulating stacked structure 102A, the upper conductive structure 183, and the lower conductive structure 163 and the lower conductive structure 165 electrically connected between the lower conductive pillar ends 128 of the conductive pillars 114 (i.e. effective conductive pillars or active conductive pillars) in the insulating stacked structure 102A may be functioned as bit lines. For example, the upper conductive structure 181 may be functioned as a local bit line, the upper conductive structure 183 may be functioned as a global bit line or a common bit line, and the local bit line is electrically to the global bit line through the conductive pillars 114 in the insulating stacked structure 102A, the lower conductive structure 163, the transistor 161, and the lower conductive structure 165. The transistor 161 (switch) may be functioned as a bit line transistor (bit line switch). The conductive pillar 114 in the insulating stacked structure 102A may be functioned as a bit line contact for the memory cells.

The upper conductive structure 191 may be electrically connected on and between the conductive plug 116 and the upper conductive pillar end 127 of the conductive pillar 114 of the column structure 112 in the staircase structure 101. The semiconductor device 129 may comprise a transistor 192 and a lower conductive structure 194. The lower conductive structure 194 is electrically connected to the transistor 192. The lower conductive structure 194 is electrically connected between the transistor 192 and the lower conductive pillar end 128 of the conductive pillar 114 of the column structure 112 in the staircase structure 101. In embodiments, the conductive pillar 114 (i.e. effective conductive pillar or active conductive pillar) of the column structure 112 in the staircase structure 101, the upper conductive structure 191, the conductive plug 116, the lower conductive structure 194 may be functioned as a word line. The transistor 192 (switch) may be functioned as a word line transistor (word line switch). The conductive pillar 114 in the staircase structure 101 may be functioned as a word line contact for the memory cells.

Some of the conductive pillars 114 of the column structures 112 in the staircase structure 101 may be electrically floating and therefore referred to as dummy conductive pillars. For example, as shown in FIG. 5, the conductive pillars 114 of the column structures 112 in the staircase structure 101, in the staircase structure 101B, in the staircase structure 101D and in the staircase structure 101F may be electrically floating, and the conductive pillars 114 of the column structures 112 in the staircase structure 101A, in the staircase structure 101C, in the staircase structure 101E and in the staircase structure 101G are not electrically floating.

A decoder may be disposed below the main stacked structure 100 and the staircase structure 101. The bit line transistor and the source line transistor may be disposed on a substrate (not shown) adjacent to a periphery region of the memory device 10. In an embodiment, the bit line transistor and the source line transistor may be disposed on the substrate and directly beneath the memory device 10 so as to form a CMOS under array design.

In an embodiment, the lower conductive structure 163 and the lower conductive structure 165 may include, but not limit to, a first bottom metal layer (BM1), a second bottom metal layer (BM2), a third bottom metal layer (BM3) and conductive bottom vias disposed between bottom metal layers and providing electrical connections therebetween.

In an embodiment, the conductive layer 130 may include a first top metal layer (TM1) and/or a second top metal layer (TM2).

The tubular elements 113 in the staircase structure 101 and the insulating stacked structure 102 may have the same lateral cross-sectional area, for example, the cross-sectional area in the X-Y plane. The lateral cross-sectional area of the tubular element 113 may be larger than a lateral cross-sectional area of the pillar element 122, for example, a diameter of the cross-sectional area of the tubular element 113 in the X-Y plane is larger than a diameter of the cross-sectional area of the pillar element 122 in the X-Y plane.

FIGS. 6-15 schematically illustrate a method for manufacturing a memory device 10 according to an embodiment of the present disclosure.

Figure 6:
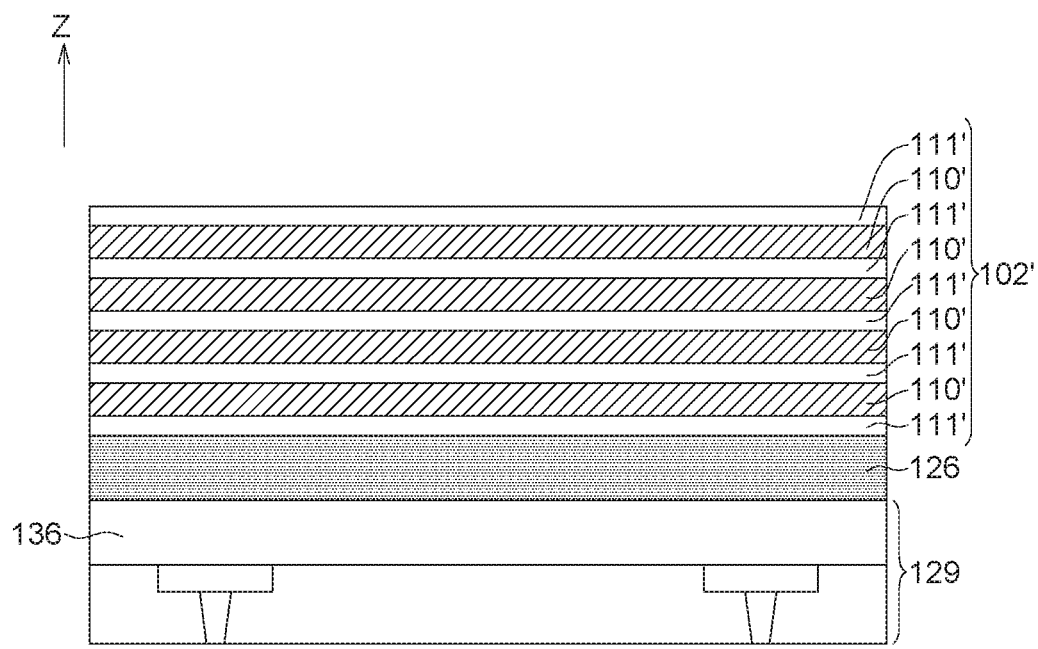
FIGS. 6-15 schematically illustrate a method for manufacturing a memory device according to an embodiment of the present disclosure.

Referring to FIG. 6, the semiconductor device 129 is provided below or under the polycrystalline semiconductor layer 126. The semiconductor device 129 may have a structure as described above with reference to FIG. 1. In an embodiment, the semiconductor device 129 may include, but not limit to, a first bottom metal layer (BM1), a second bottom metal layer (BM2), a third bottom metal layer (BM3) and conductive bottom vias disposed between bottom metal layers and providing electrical connections therebetween. The semiconductor device 129 may include other possible conductive circuits formed in the inter-layer dielectric layer or on the inter-layer dielectric layer. The present disclosure is not limited thereto. In an embodiment, the semiconductor device 129 is formed on a substrate (not shown) in a front-end-of-line (FEOL) process.

The semiconductor device 129 may comprise a dielectric layer 136 (top dielectric layer). In an embodiment, the dielectric layer 136 may be formed on third bottom metal layer (BM3). The dielectric layer 136 may include dielectric material comprising an oxide such as silicon oxide. The polycrystalline semiconductor layer 126 is then formed over the dielectric layer 136. The polycrystalline semiconductor layer 126 may include a doped semiconductor material, such as P+ type polysilicon, or an undoped semiconductor material. In an embodiment, the dielectric layer 136 and the polycrystalline semiconductor layer 126 may be formed by a deposition process, such as a chemical vapor deposition (CVD) process.

An insulating stacked structure 102' is formed over the polycrystalline semiconductor layer 126. The insulating stacked structure 102' may include second insulating layers 110' and third insulating layers 111' stacked alternately, for example, along the Z direction. The third insulating layers 111' are separated from each other by second insulating layers 110'. In an embodiment, the second insulating layers 110' may include insulating materials, comprising a nitride such as silicon nitride. The third insulating layers 111' may include insulating materials comprising an oxide such as silicon oxide. In an embodiment, the second insulating layers 110' and the third insulating layers 111' includes different materials. In an embodiment, the insulating stacked structure 102' may be formed by depositing the third insulating layers 111' and the second insulating layers 110' sequentially.

Figure 7:
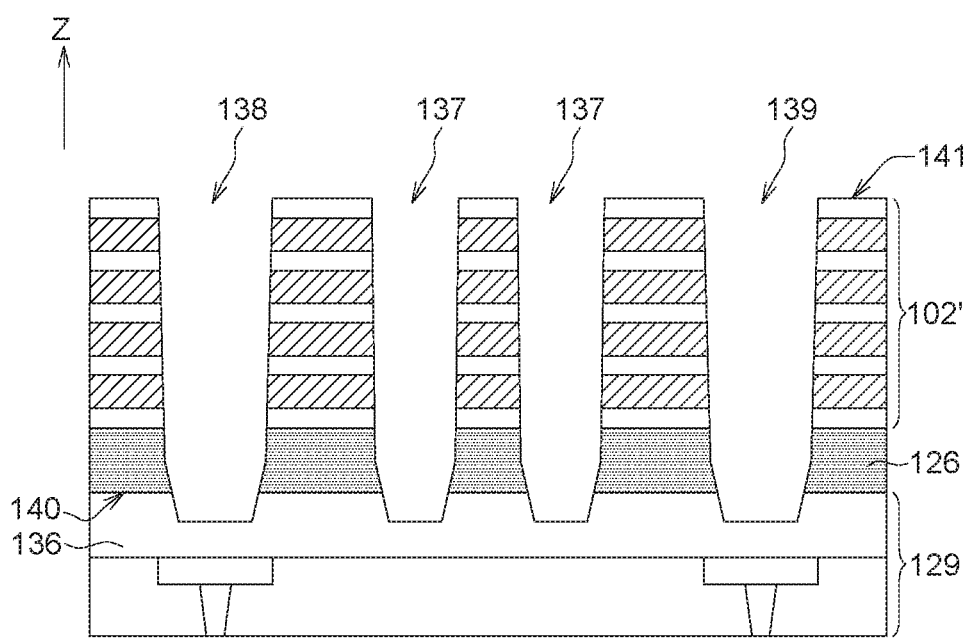

Referring to FIG. 7, the insulating stacked structure 102' is patterned, such as by a photolithography process, to form an first hole 137, a second hole 138 and a third hole 139 in the insulating stacked structure 102'. The first hole 137, the second hole 138 and the third hole 139 pass through the insulating stacked structure 102' and the polycrystalline semiconductor layer 126 in the Z direction. The first hole 137, the second hole 138 and the third hole 139 expose sidewalls of the insulating stacked structure 102' and the polycrystalline semiconductor layer 126. In an embodiment, the first hole 137, the second hole 138 and the third hole 139 may be formed by applying an etching process, such as a wet etching process or a dry etching process, to the insulating stacked structure 102' and stopping the etching process as slightly exceeding a bottom surface 140 of the polycrystalline semiconductor layer 126. In an embodiment, the polycrystalline semiconductor layer 126 may be considered as an etching stopping layer. The etching process may be stopped at the dielectric layer 136. In an embodiment, the first hole 137, the second hole 138 and the third hole 139 may taper off from a top surface 141 of the insulating stacked structure 102' to the bottom surface 140 of the polycrystalline semiconductor layer 126 along the Z direction. In an embodiment, each of the first hole 137, the second hole 138 and the third hole 139 may have a lateral cross-sectional area (e.g. a cross-sectional area in the X-Y plane) getting smaller from the top surface 141 of the insulating stacked structure 102' to the bottom surface 140 of the polycrystalline semiconductor layer 126 along the Z direction. In an embodiment, in any one of the X-Y plane which intersect the first hole 137, the second hole 138 and the third hole 139, the cross-sectional area of the first hole 137 may be smaller than the cross-sectional area of the second hole 138, the cross-sectional area of the first hole 137 may be smaller than the cross-sectional area of the third hole 139, and the cross-sectional area of the second hole 138 may be similar to the cross-sectional area of the third hole 139.

Figure 8:
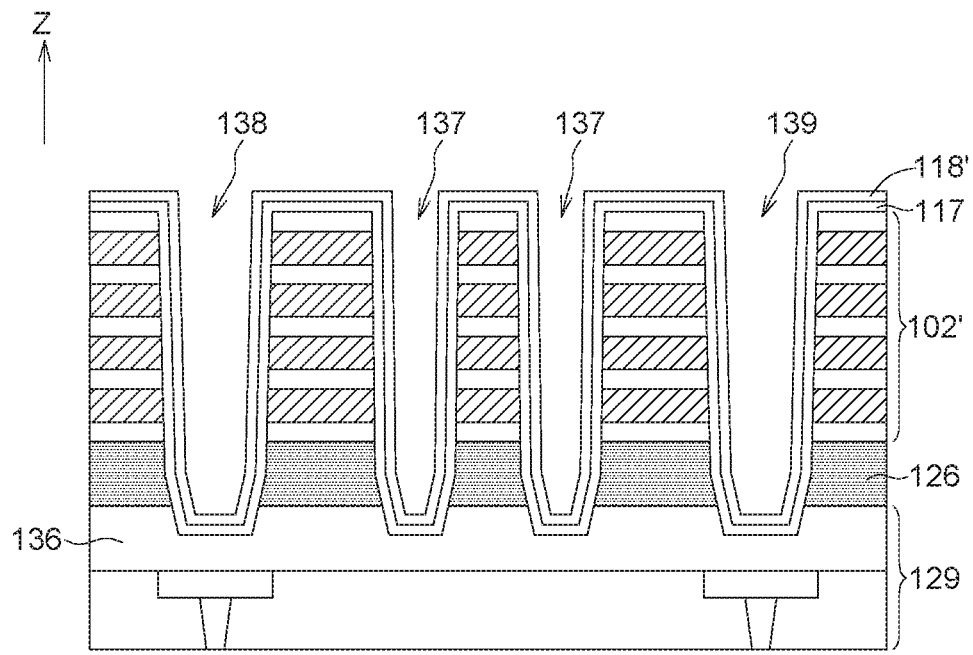

Referring to FIG. 8, a memory film 117 and a channel layer 118' is formed over the insulating stacked structure 102' and lining the first hole 137, the second hole 138 and the third hole 139. In the first hole 137, the second hole 138 and the third hole 139, the memory film 117 and the channel layer 118' is formed in inner sidewalls and bottoms of the first hole 137, the second hole 138 and the third hole 139. In an embodiment, the memory film 117 and the channel layer 118' may be formed by a deposition process, such as a chemical vapor deposition process. In one example, the memory film 117 and the channel layer 118' is formed in a furnace.

The memory film 117 may include multilayer structure known from memory technologies as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon), or combinations of those layers. The channel layer 118' may include a semiconductor material, such as a doped semiconductor material or an undoped semiconductor material. In an embodiment, the channel layer 118' may include polysilicon, such as a doped polysilicon or an undoped polysilicon.

Figure 9:
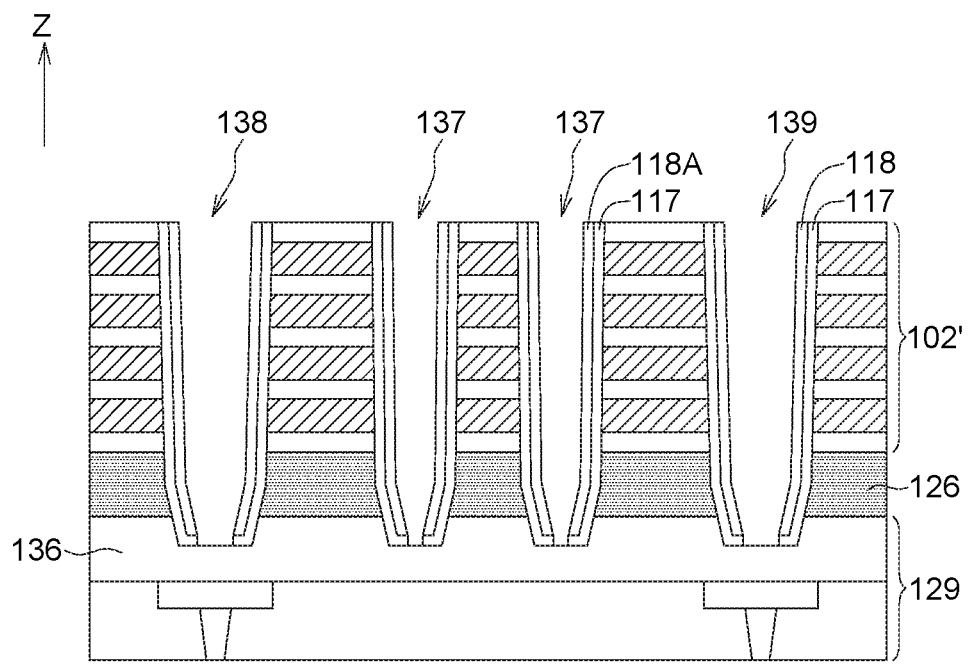

Referring to FIG. 9, the memory film 117 and the channel layer 118' above the insulating stacked structure 102' are removed to expose the top of the insulating stacked structure 102', and form a planar top surface of the structure in the X-Y plane. The channel layer 118' may comprise the dummy channel layer 118, the channel layer 118A, etc. illustrated with referring to FIG. 1. In this process stage, the channel layer 118' and the memory film 117 at the bottoms of the first hole 137, the second hole 138 and the third hole 139 is removed so as to expose the dielectric layer 136. That is to say, the channel layer 118/118A at the bottoms of the first hole 137, the second hole 138 and the third hole 139 is disconnected so as to prevent current leakage path. The channel layer 118/118A may have a tubular shape with two open ends. In an embodiment, the memory film 117 above the insulating stacked structure 102', the channel layer 118' above the insulating stacked structure 102', and the channel layer 118' and the memory film 117 at the bottoms of the first hole 137, the second hole 138 and the third hole 139 may be removed by an etching-back process.

Figure 10:
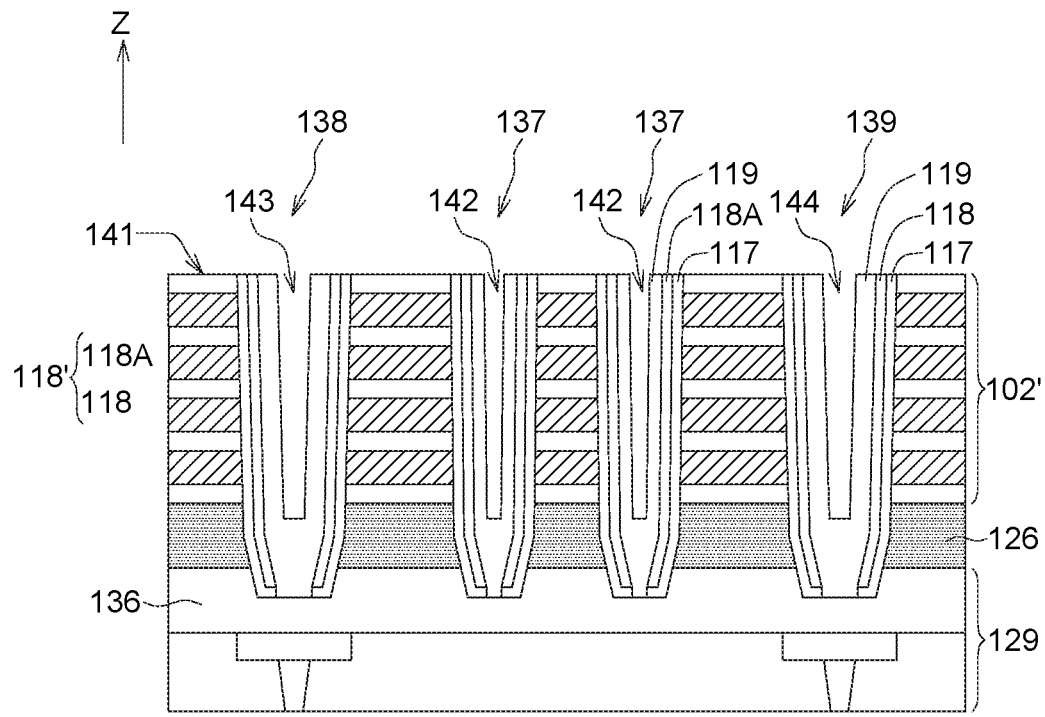

Referring to FIG. 10, an insulating film 119 is formed in the first hole 137, the second hole 138 and the third hole 139. The insulating film 119 may include dielectric material comprising an oxide such as silicon oxide. In an embodiment, the insulating film 119 may be formed by the following steps: the insulating film 119 is deposited above the insulating stacked structure 102' and filling the first hole 137, the second hole 138 and the third hole 139; the insulating film 119 above the insulating stacked structure 102' is removed to expose the top surface 141 of the insulating stacked structure 102', such as by a chemical-mechanical planarization process or an etching-back process; a first opening 142, a second opening 143 and a third opening 144 are formed in the insulating films 119 in the first hole 137, the second hole 138 and the third hole 139 respectively, such as by a wet etching process or a dry etching process. The first opening 142, the second opening 143 and the third opening 144 extend along the Z direction and expose sidewalls of the insulating films 119 in the first hole 137, the second hole 138 and the third hole 139. In an embodiment, the etching process for forming the first opening 142, the second opening 143 and the third opening 144 may be stopped at the insulating films 119. In an embodiment, the first opening 142, the second opening 143 and the third opening 144 may be in the centers of the first hole 137, the second hole 138 and the third hole 139 respectively.

In an embodiment, in any one of the X-Y plane which intersect the first opening 142, the second opening 143 and the third opening 144, the cross-sectional area of the first opening 142 may be smaller than the cross-sectional area of the second opening 143, the cross-sectional area of the first opening 142 may be smaller than the cross-sectional area of the third opening 144, and the cross-sectional area of the second opening 143 may be similar to the cross-sectional area of the third opening 144.

Figure 11:
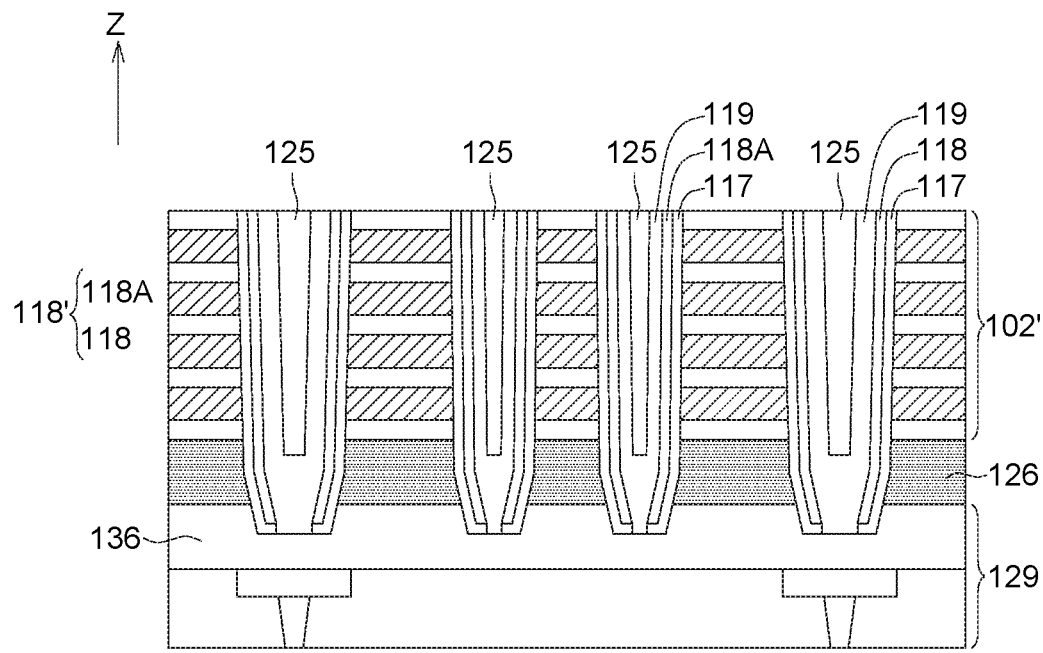

Referring to FIG. 11, insulating pillars 125 are formed in the first opening 142, the second opening 143 and the third opening 144 respectively. The insulating pillar 125 may include an insulating material, comprising a nitride such as silicon nitride. The insulating pillar 125 may be formed by a deposition process, such as a chemical vapor deposition process.

Figure 12:
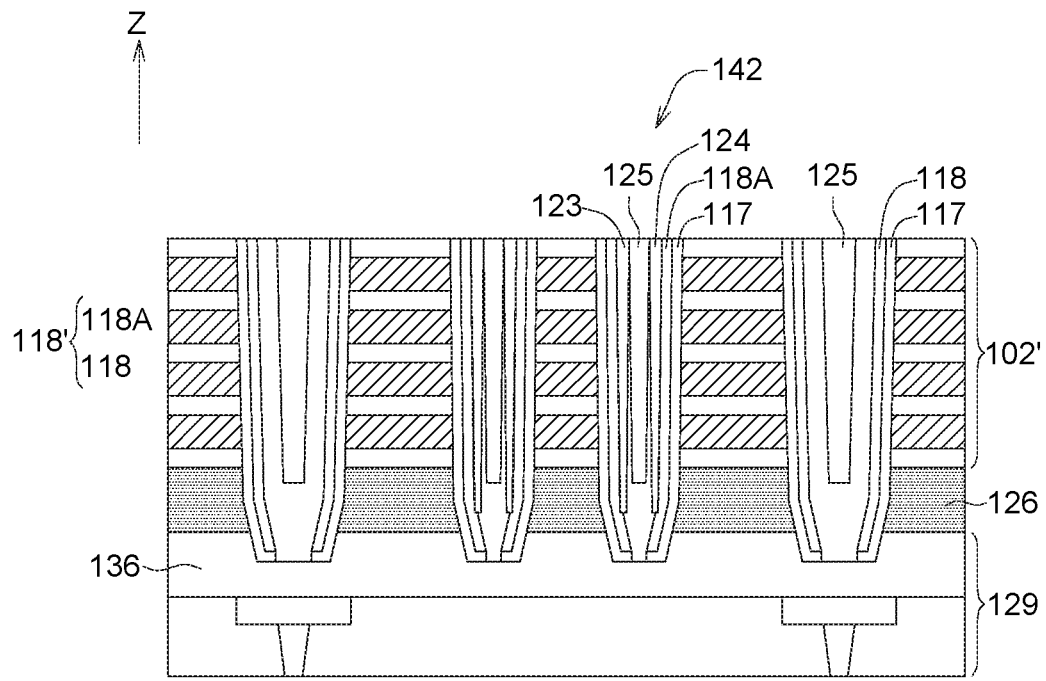

Referring to FIG. 12, a source/drain pillar 123 and a source/drain pillar 124 are formed on opposite sides of the insulating pillar 125 formed in the first opening 142. The source/drain pillar 123 and the source/drain pillar 124 are separated by the insulating pillar 125. The source/drain pillar 123 and the source/drain pillar 124 may be formed by the following steps: two narrow openings are formed on opposite sides of the insulating pillar 125 formed in the first opening 142, and the narrow openings may expose sidewalls of the channel layer 118A, and/or sidewalls of the insulating pillar 125; the source/drain pillar 123 and the source/drain pillar 124 are formed in the narrow openings respectively to fill the narrow openings. In an embodiment, the narrow openings are formed by an etching process, such as a wet etching process or a dry etching process. The narrow openings may not overlap to each other. In an embodiment, the source/drain pillar 123 and the source/drain pillar 124 may be formed by a deposition process, such as a chemical vapor deposition process. The source/drain pillar 123/124 may include doped semiconductor material, such as a N+ type polysilicon, or an undoped semiconductor material. The disposition of the insulating pillar 125 between the source/drain pillar 123 and the source/drain pillar 124 contributes to improve the process window to prevent punch through (PLG-to-PLG punch).

Figure 13:
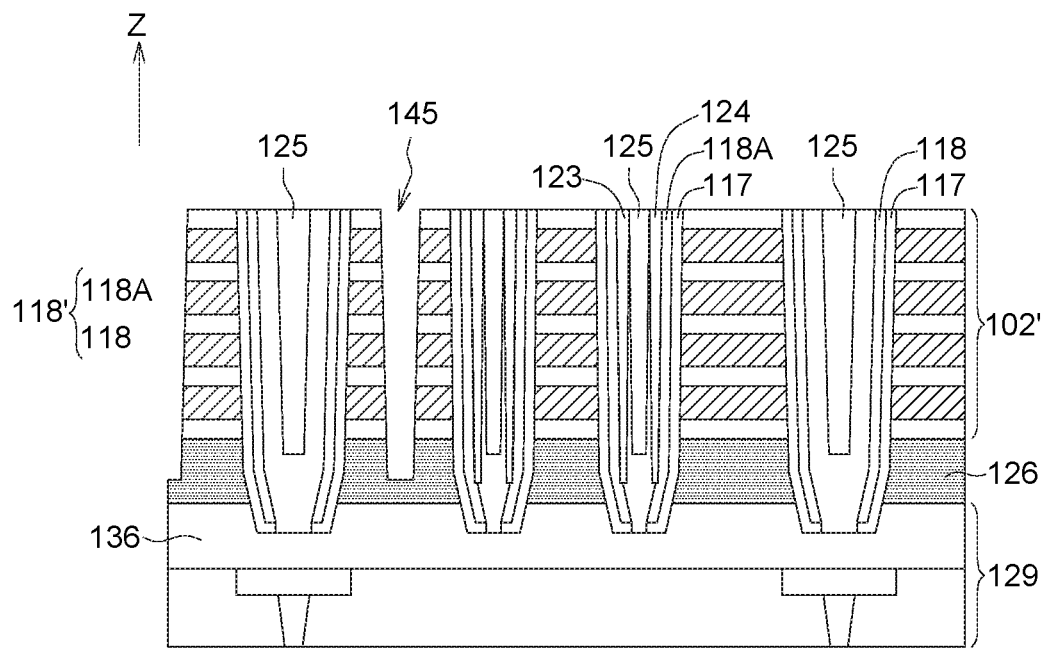

Referring to FIG. 13, a trench 145 is formed in the insulating stacked structure 102'. The trench 145 passes through the insulating stacked structure 102' in the Z direction. The trench 145 exposes sidewalls of the insulating stacked structure 102' and the polycrystalline semiconductor layer 126. In an embodiment, the trench 145 may be formed by applying an etching process, such as a wet etching process or a dry etching process, to the insulating stacked structure 102' and stopping the etching process at the polycrystalline semiconductor layer 126.

Figure 14:
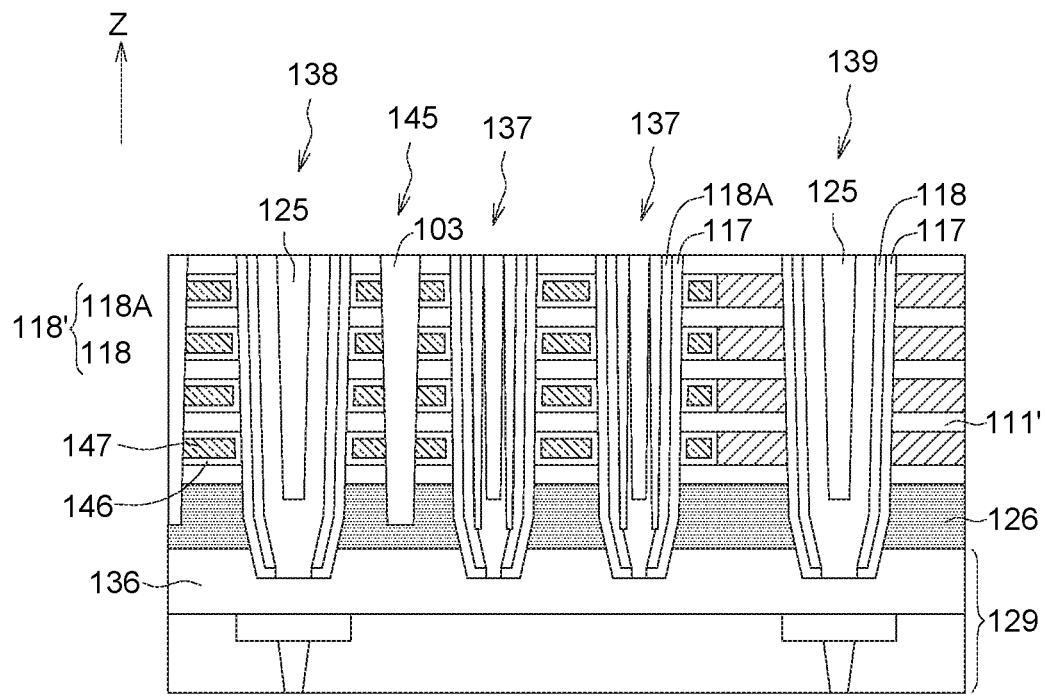

Referring to FIG. 14, a part of the second insulating layers 110' (i.e. the second insulating layers 110' surrounding the first hole 137 and the second hole 138) is removed by applying an etching process through the trench 145 to form spaces between the third insulating layers 111'. In an embodiment, the etching process may use hot phosphoric acid ($H_3PO_4$). By the control of the etching time, a part of the second insulating layers 110' is removed while the other part of the second insulating layers 110' (i.e. the second insulating layers 110' surrounding the third hole 139) is reserved. In other words, the second insulating layers 110' surrounding the third hole 139 are not removed in the etching process. Then, a dielectric film 146 may line the spaces between the third insulating layers 111'. A conductive material 147, such as tungsten (W), may be formed to fill the spaces between the third insulating layers 111' so as to form the conductive films 104 and the conductive stair layers 106, as shown in FIG. 1. The dielectric film 146 may include a storage layer and a blocking layer (not shown). The dielectric film 146 may comprise a high dielectric constant material. In an embodiment, the conductive film 104 may be functioned as a gate. In an embodiment, the dielectric film 146 and the conductive film 104 are formed by a HKMG (High-k Metal Gate) process. The process encompassed in FIG. 14 may be understood as a gate replacement process.

In an embodiment, the memory device 10 may include a memory layer including the memory film 117 and the dielectric film 146. In other words, the dielectric film 146 may be used as a memory material. The memory layer may include a charge trapping structure known from memory technologies as ONO, ONONO, ONONONO, SONOS, BE-SONOS, TANOS, MA BE-SONOS, and combinations of those layers. The charge trapping structure may use nitride, such as silicon nitride or other similar high dielectric constant (high-k) material including metal oxide, such as alumina ($Al_2O_3$), hafnium dioxide ($HfO_2$) and so on. The memory cells may be defined in the memory layer. For example, in the case of the memory layer including the memory film 117 and the dielectric film 146, the memory film 117 may be understood as a tunneling oxide layer, the memory film 117 may include silicon dioxide ($SiO_2$) or merely include silicon dioxide; the dielectric film 146 may be used as a memory material, and the dielectric film 146 may include a multilayer memory material, such as alumina, titanium nitride (TiN), ONO, ONONO, ONONONO, SONOS, BE-SONOS, TANOS, MA BE-SONOS, and combinations thereof.

Then, an insulating element 103 is formed to fill the trench 145, such as by a deposition process.

Figure 15:
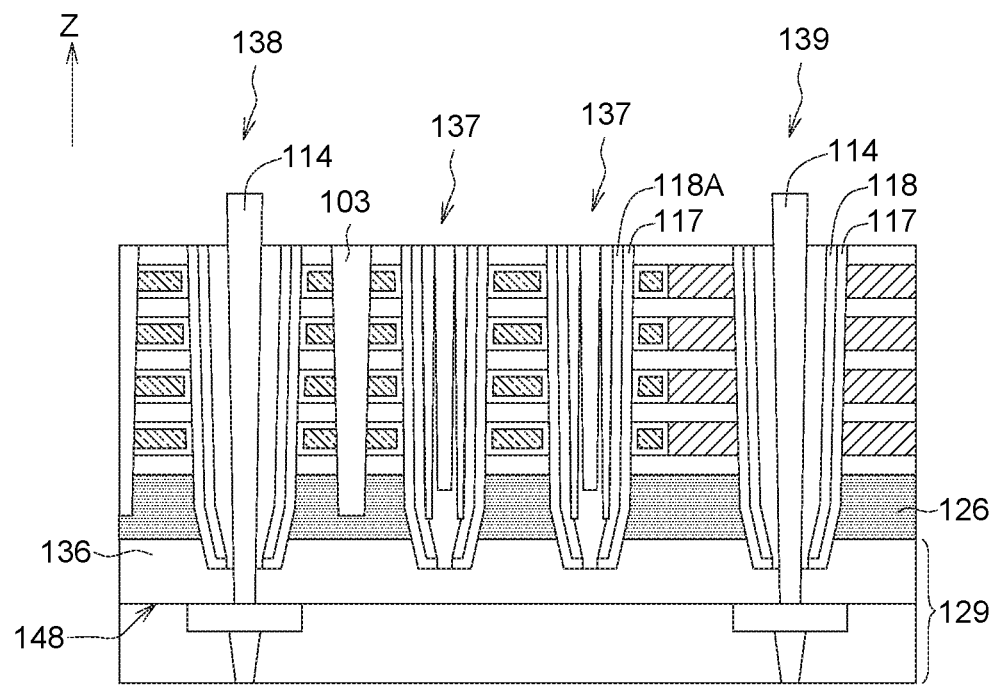

Referring to FIG. 15, conductive pillars 114 are formed in the insulating films 119 formed in the second hole 138 and the third hole 139. The conductive pillars 114 extend along the Z direction, pass through the dielectric layer 136, and contact the semiconductor device 129, such as a third bottom metal layer (BM3). The conductive pillar 114 may include a conductive material, such as tungsten (W). In an embodiment, the conductive pillars 114 may be formed by the following steps: the insulating pillars 125 formed in the second opening 143 and the third opening 144 (as depicted in FIGS. 10-11) are removed by an etching process, such as a wet etching process or a dry etching process; the etching process may be stopped at a bottom surface 148 of the dielectric layer 136; deep openings are formed by the etching process; the conductive pillars 114 are formed in the deep openings respectively by a deposition process, such as a chemical vapor deposition process. The conductive pillars 114 are electrically connected to the semiconductor device 129. In this process stage, the conductive pillar 114 formed in the second hole 138 may be understood as the conductive pillar 114 in the staircase structure 101, and the conductive pillar 114 formed in the third hole 139 may be understood as the conductive pillar 114 in the insulating stacked structure 102A, as shown in FIG. 1.

The present disclosure provides a memory device with the bit line contact, the source line contact and/or the word line contact enclosed by the dummy channel layer, and the bit line contact, the source line contact and/or the word line contact may be protected and electrically isolated by the tubular element. With such a configuration, an additional isolation zone in the memory device for electrically isolating the bit line contact, the source line contact and/or the word line contact may be omitted, the space efficiency of the memory device may be improved, the production cost may be reduced, the design freedom of the memory device may be improved, and the manufacturing process integration may be improved. Further, the present disclosure provides a memory device with the polycrystalline semiconductor layer used as an etching stopping layer; the polycrystalline semiconductor layer contributes to improve the uniformity of the holes for the pillar elements as well as the controllability of the etching process.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor structure, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a stacked structure;
   a tubular element penetrating the stacked structure, wherein the tubular element comprises a dummy channel layer and a memory film, and the dummy channel layer is between the memory film and the conductive pillar;
   a conductive pillar enclosed by the tubular element and extending beyond a bottom surface of the dummy channel layer;
   memory cells in the stacked structure and electrically connected to the conductive pillar; and
   a polycrystalline semiconductor layer below the memory cells, wherein the tubular element and the conductive pillar pass through the polycrystalline semiconductor layer, and a portion of an outer surface of the conductive pillar is covered by the tubular element.

2. The memory device according to claim 1, wherein the memory film has a tubular shape.

3. The memory device according to claim 1, wherein the tubular element further comprises an insulating film between the conductive pillar and the dummy channel layer.

4. The memory device according to claim 3, wherein the insulating film has a tubular shape.

5. The memory device according to claim 1, wherein the conductive pillar is functioned as a bit line contact, a source line contact, or a word line contact for the memory cells.

6. The memory device according to claim 1, wherein the dummy channel layer has a tubular shape.

7. The memory device according to claim 1, further comprising a semiconductor device below and electrically connected to a lower conductive pillar end of the conductive pillar.

8. The memory device according to claim 7, wherein the semiconductor device comprises a bit line switch or a source line switch.

9. The memory device according to claim 7, wherein the semiconductor device comprises an active device and/or a passive device.

10. The memory device according to claim 1, wherein the stacked structure comprises an insulating stacked structure, the tubular element and the conductive pillar pass through the insulating stacked structure.

11. The memory device according to claim 10, further comprising a conductive layer above and electrically connected between the memory cells and an upper conductive pillar end of the conductive pillar.

12. The memory device according to claim 11, wherein the conductive pillar is functioned as a bit line contact or a source line contact.

13. The memory device according to claim 11, wherein the conductive layer comprises a local bit line and a global bit line, and the local bit line is electrically connected to the global bit line through the conductive pillar in the insulating stacked structure.

14. The memory device according to claim 13, further comprising a semiconductor device below, wherein the local bit line is electrically connected to the global bit line through the semiconductor device and the conductive pillar in the insulating stacked structure.

15. The memory device according to claim 1, wherein the stacked structure comprises an insulating stacked structure, the memory device further comprises a lower conductive structure below or under the insulating stacked structure and column structures, each of the column structures comprises the tubular element and the conductive pillar, and passes through the insulating stacked structure, lower conductive pillar ends of the conductive pillars are electrically connected to each other by the lower conductive structure.

16. The memory device according to claim 1, wherein the stacked structure comprises a staircase structure comprising conductive stair layers, the memory device further comprises a conductive plug electrically connected and disposed on one conductive stair layer of the conductive stair layers, wherein the tubular element and the conductive pillar pass through the one conductive stair layer of the conductive stair layers.

17. The memory device according to claim 16, wherein the tubular element and the conductive pillar further pass through another conductive stair layer below the one conductive stair layer.

18. The memory device according to claim 16, further comprising a conductive layer above and electrically connected between the conductive plug and the conductive pillar.

* * * * *